(12) United States Patent
Li et al.

(10) Patent No.: US 7,881,029 B1
(45) Date of Patent: Feb. 1, 2011

(54) DEPLETION-MODE FIELD EFFECT TRANSISTOR BASED ELECTROSTATIC DISCHARGE PROTECTION CIRCUIT

(75) Inventors: Jason Yuxin Li, Jamestown, NC (US); Walter A. Wohlmuth, Greensboro, NC (US); Swaminathan Muthukrishnan, Greensboro, NC (US); Christian Rye Iversen, Vestbjerg (DK); Nathaniel Peachey, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 116 days.

(21) Appl. No.: 12/168,178

(22) Filed: Jul. 7, 2008

(51) Int. Cl.
*H02H 3/22* (2006.01)
(52) U.S. Cl. ......................... 361/56; 361/111
(58) Field of Classification Search .................. 361/56, 361/58, 111
See application file for complete search history.

(56) References Cited

U.S. PATENT DOCUMENTS

| | | | |
|---|---|---|---|
| 7,280,332 B2 | 10/2007 | Ma et al. | |
| 7,538,995 B2* | 5/2009 | Okushima | 361/56 |
| 7,593,204 B1* | 9/2009 | Iversen et al. | 361/56 |
| 2005/0014473 A1 | 1/2005 | Zhao et al. | |
| 2005/0189560 A1 | 9/2005 | Park | |
| 2005/0242365 A1 | 11/2005 | Yoo | |
| 2006/0006554 A1 | 1/2006 | Yoo et al. | |
| 2007/0103826 A1* | 5/2007 | Hung et al. | 361/56 |
| 2007/0109697 A1 | 5/2007 | Huh | |
| 2008/0062595 A1* | 3/2008 | Ping et al. | 361/56 |

OTHER PUBLICATIONS

Swaminathan Muthukrishnan et al., "A Novel On-Chip Protection Circuit for RFICs Implemented in D-Mode pHEMT Technology," RF Micro Devices, Inc., Jan. 2007.

"Transistor," http://en.wikipedia.org/wiki/Transistor (last visited Jun. 23, 2006).
"Diode," http://en.wikipedia.org/wiki/Diode (last visited Jun. 23, 2006).
"Field Effect Transistor," http://en.wikipedia.com/wiki/Field_effect_transistor (last visited Jun. 23, 2006).
"HEMT," http://en.wikipedia.com/wiki/PHEMT (last visited Jun. 23, 2006).
JEDEC Solid State Technology Association, "Electrostatic Discharge (ESD) Sensitivity Testing Human Body Model (HBM)," JESD22-A114C (Revision of JEDS22-A114-B), Jan. 2005, pp. 1-14, Arlington, VA.
Electronic Industries Association/JEDEC Solid State Technology Association, "Electrostatic Discharge (ESD) Sensitivity Testing Machine Model (MM)," EIA/JESD22-A115-A (Revision of EIA/JESD22-A115), Oct. 1997, pp. 1-9, Arlington, VA.
Notice of Allowance/Fees Due mailed Sep. 22, 2010 for U.S. Appl. No. 12/168,179.

* cited by examiner

*Primary Examiner*—Danny Nguyen
(74) *Attorney, Agent, or Firm*—Withrow & Terranova, P.L.L.C.

(57) ABSTRACT

The present invention relates to an electrostatic discharge (ESD) clamp circuit that is used to protect other circuitry from high voltage ESD events. The ESD clamp circuit may include a field effect transistor (FET) element as a clamping element, which is triggered by using a drain-to-gate capacitance and a drain-to-gate resistance of the FET element and a resistive element as a voltage divider to divide down an ESD voltage to provide a triggering gate voltage of the FET element. In its simplest embodiment, the ESD clamp circuit includes only an FET element, a resistive element, a source-coupled level shifting diode, and a reverse protection diode. Therefore, the ESD clamp circuit may be small compared to other ESD protection circuits. The simplicity of the ESD clamp circuit may minimize parasitic capacitances, thereby maximizing linearity of the ESD clamp circuit over a wide frequency range.

23 Claims, 12 Drawing Sheets

DEPLETION-MODE FIELD EFFECT TRANSISTOR BASED ELECTROSTATIC DISCHARGE PROTECTION CIRCUIT

CROSS-REFERENCE TO RELATED APPLICATIONS

This application is related to U.S. patent application Ser. No. 11/609,497 entitled ON-CHIP ESD PROTECTION CIRCUIT FOR RADIO FREQUENCY (RF) INTEGRATED CIRCUITS filed Dec. 12, 2006, the disclosure of which is hereby incorporated herein by reference in its entirety.

FIELD OF THE INVENTION

The present invention relates to electrostatic discharge (ESD) protection circuits, which may be used to protect other circuits from the high voltages associated with ESD events.

BACKGROUND OF THE INVENTION

Electrostatic discharge (ESD), which is a large subset of electrical overstress (EOS), is a major reliability issue in integrated circuits (ICs). As semiconductor devices have scaled to smaller dimensions and ICs have become more complex, the potential for destructive ESD events has become more serious. More recently, there has been a tremendous demand for increasing the ESD robustness of Radio Frequency (RF) ICs, especially for wireless applications, such as handheld devices.

ESD protection for Silicon-based technologies, such as complementary metal oxide semiconductor (CMOS) technology, is relatively mature. However, ESD protection circuitry for newer technologies, particularly those involving compound semiconductor materials, such as Gallium Arsenide, is still in its infancy. Compound semiconductor materials are those compounds formed from multiple elements from the periodic table of the elements.

Gallium Arsenide is often used for RF power amplifiers and RF switches because of its intrinsically high low-field electron mobility and breakdown voltage. For RF low noise amplifiers, RF switches, and RF power amplifiers, Gallium Arsenide pseudomorphic high electron mobility transistor (pHEMT) technology may be used. However, ESD protection circuitry for Gallium Arsenide pHEMT technology that is currently in use may provide undesirable characteristics. Gallium Arsenide pHEMT ESD protection structures may have unwanted parasitic capacitances and resistances which may adversely affect performance of RF circuits. Ideally, an ESD protection circuit must not affect an input or output signal under normal operating conditions and must not affect the normal operation of the circuit it is protecting. At RF frequencies, the parasitics associated with the ESD protection structures can lead to impedance mismatches, which may cause signal reflection that degrades the performance of the circuit it is protecting. Thus, there is a need for an ESD protection circuit that has small parasitic capacitance, is linear over a wide frequency range, and can be integrated with other compound semiconductor-based circuits on a single-die.

SUMMARY OF THE EMBODIMENTS

The present invention relates to an electrostatic discharge (ESD) clamp circuit that is used to protect other circuitry from high voltage ESD events. The ESD clamp circuit may include a field effect transistor (FET) element as a clamping element, which is triggered by using a drain-to-gate capacitance and a drain-to-gate resistance of the FET element and a resistive element as a voltage divider to divide down an ESD voltage to provide a triggering gate voltage of the FET element. In its simplest embodiment, the ESD clamp circuit includes only an FET element, a resistive element, a source-coupled level shifting diode, and a reverse protection diode. Therefore, the single FET element ESD clamp circuit may be small compared to other ESD protection circuits. The simplicity and small size of the single FET element ESD clamp circuit may minimize parasitic capacitances, thereby maximizing linearity of the single FET element ESD clamp circuit over a wide frequency range.

The FET element may include a compound semiconductor material, such as Gallium Arsenide, Indium Phosphide, Gallium Nitride, and various combinations of elements from columns III and V of the periodic table of the elements. Embodiments of the present invention may include compound semiconductor junction field effect transistor (JFET) elements, pseudomorphic high electron mobility transistor (pHEMT) elements, high electron mobility transistor (HEMT) elements, modulation-doped field effect transistor (MODFET) elements, heterojunction-insulator-gate field effect transistor (HIGFET) elements, metal-semiconductor field effect transistor (MESFET) elements, or any combination thereof. These FET elements can be normally-on devices which require a negative gate bias to turn the devices off. These normally-on devices are termed depletion-mode devices. The FET elements can be configured as multiple FET elements coupled in series, multiple FET elements coupled in parallel, single-gate FET elements, multi-gate FET elements, or any combination thereof.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to an electrostatic discharge (ESD) clamp circuit that is used to protect other circuitry from high voltage ESD events. The ESD clamp circuit may include a field effect transistor (FET) element as a clamping element, which may be triggered by using a drain-to-gate capacitance and a drain-to-gate resistance of the FET element and a resistive element as a voltage divider to divide down an ESD voltage to provide a triggering gate voltage of the FET element. In its simplest embodiment, the ESD clamp circuit includes only an FET element, a level shifting circuit, a reverse protection circuit, and a resistive element.

The FET element may include a compound semiconductor material, such as Gallium Arsenide, Indium Phosphide, Gallium Nitride, various combinations of elements from columns III and V of the periodic table of the elements, or any combination thereof. Embodiments of the present invention may include compound semiconductor junction field effect transistor (JFET) elements, pseudomorphic high electron mobility transistor (pHEMT) elements, high electron mobility transistor (HEMT) elements, modulation-doped field effect transistor (MODFET) elements, heterojunction-insulator-gate field effect transistor (HIGFET) elements, metal-semiconductor field effect transistor (MESFET) elements, or any combination thereof. These FET elements may be normally-on devices, which require a negative gate bias to turn the devices off. These normally-on devices are termed depletion-mode devices. The depletion-mode FET elements are normally off in the ESD clamp circuit by using a source-coupled level shifting circuit, which raises the voltage at a source relative to a gate electrode. These FET elements can be configured as multiple FET elements coupled in series, multiple FET elements coupled in parallel, single-gate FET elements, multi-gate FET elements, or any combination thereof.

Figure 1:
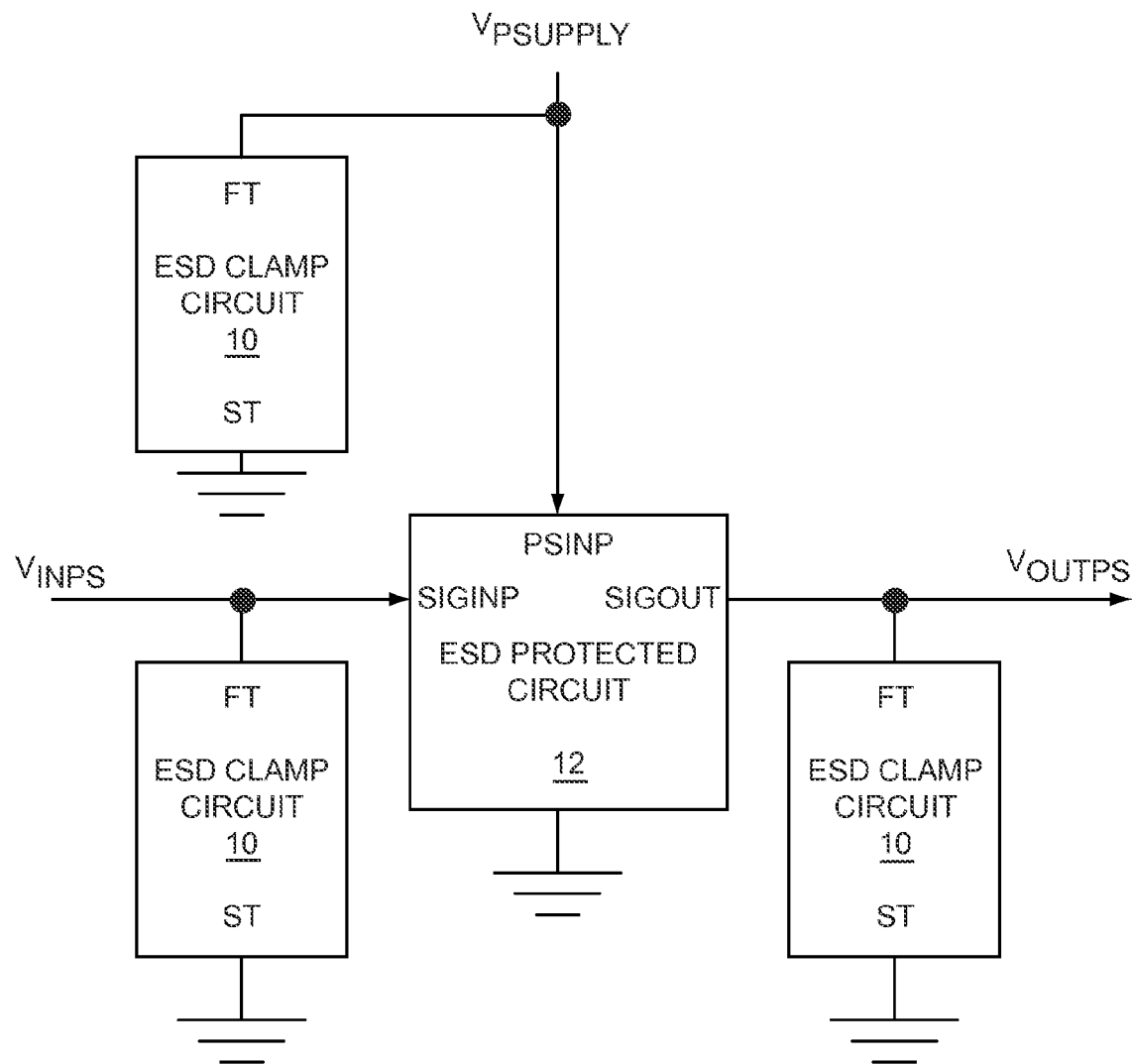
FIG. 1 shows electrostatic discharge (ESD) clamp circuits coupled to an ESD protected circuit, according to one embodiment of the present invention.

FIG. 1 shows ESD clamp circuits 10 coupled to an ESD protected circuit 12, according to one embodiment of the present invention. Each ESD clamp circuit 10 has a first terminal FT coupled to a node to be protected, and a second terminal ST coupled to a direct current (DC) reference, such as ground. Normally, the ESD clamp circuit 10 is in a non-clamping state, such that a high impedance is presented between the first and second terminals FT, ST; however, when the voltage between the first and second terminals FT, ST exceeds an ESD trigger voltage, which may be associated with an ESD event, the ESD clamp circuit 10 transitions to a clamping state, such that a low impedance is presented between the first and second terminals FT, ST to dissipate energy associated with the ESD event to protect the ESD protected circuit 12. The ESD trigger voltage may vary depending on a rise time of the voltage between the first and second terminals FT, ST. Additionally, the ESD trigger voltage may vary depending on whether the voltage of an ESD event at the first terminal FT is positive with respect to the voltage at the second terminal ST, or vice versa. In one embodiment of the present invention, when the voltage of an ESD event at the first terminal FT is positive with respect to the voltage at the second terminal ST, the ESD trigger voltage ranges from about 10 volts to about 20 volts. In an exemplary embodiment of the present invention, when the voltage of an ESD event at the first terminal FT is positive with respect to the voltage at the second terminal ST, the ESD trigger voltage ranges from about 14 volts to about 16 volts.

The ESD protected circuit 12 has a power supply input PSINP coupled to a DC power supply $V_{PSUPPLY}$, a signal input SIGINP, which receives an input signal $V_{INPS}$, and a signal output SIGOUT, which provides an output signal $V_{OUTPS}$. An ESD clamp circuit 10 may be coupled to and protect the power supply input PSINP, the signal input SIGINP, the signal output SIGOUT, or any combination thereof. An ESD clamp circuit 10 may be coupled to any or all of the nodes of the ESD protected circuit 12 to provide ESD protection where needed.

Figure 2:
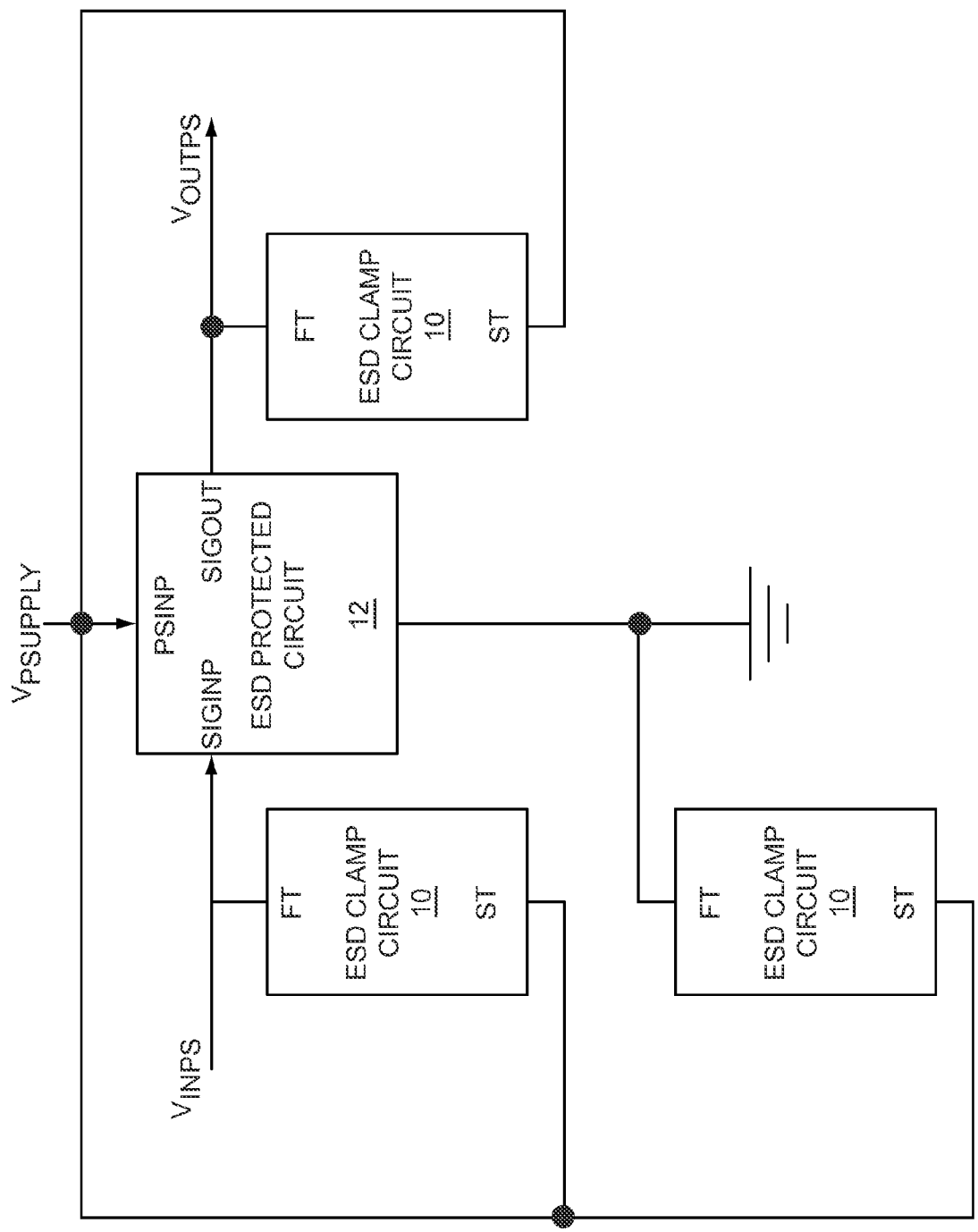
FIG. 2 shows the ESD clamp circuits illustrated in FIG. 1 coupled to a direct current (DC) power supply instead of ground, according to an alternate embodiment of the present invention.

FIG. 2 shows the ESD clamp circuits 10 illustrated in FIG. 1 with each second terminal ST coupled to the DC power supply $V_{PSUPPLY}$ instead of to ground, according to an alternate embodiment of the present invention. Such a configuration may be useful for circuits having the DC power supply $V_{PSUPPLY}$ distributed throughout the ESD protected circuit 12. An ESD clamp circuit 10 may be used to protect ground from ESD events with respect to the DC power supply $V_{PSUPPLY}$.

Figure 3:
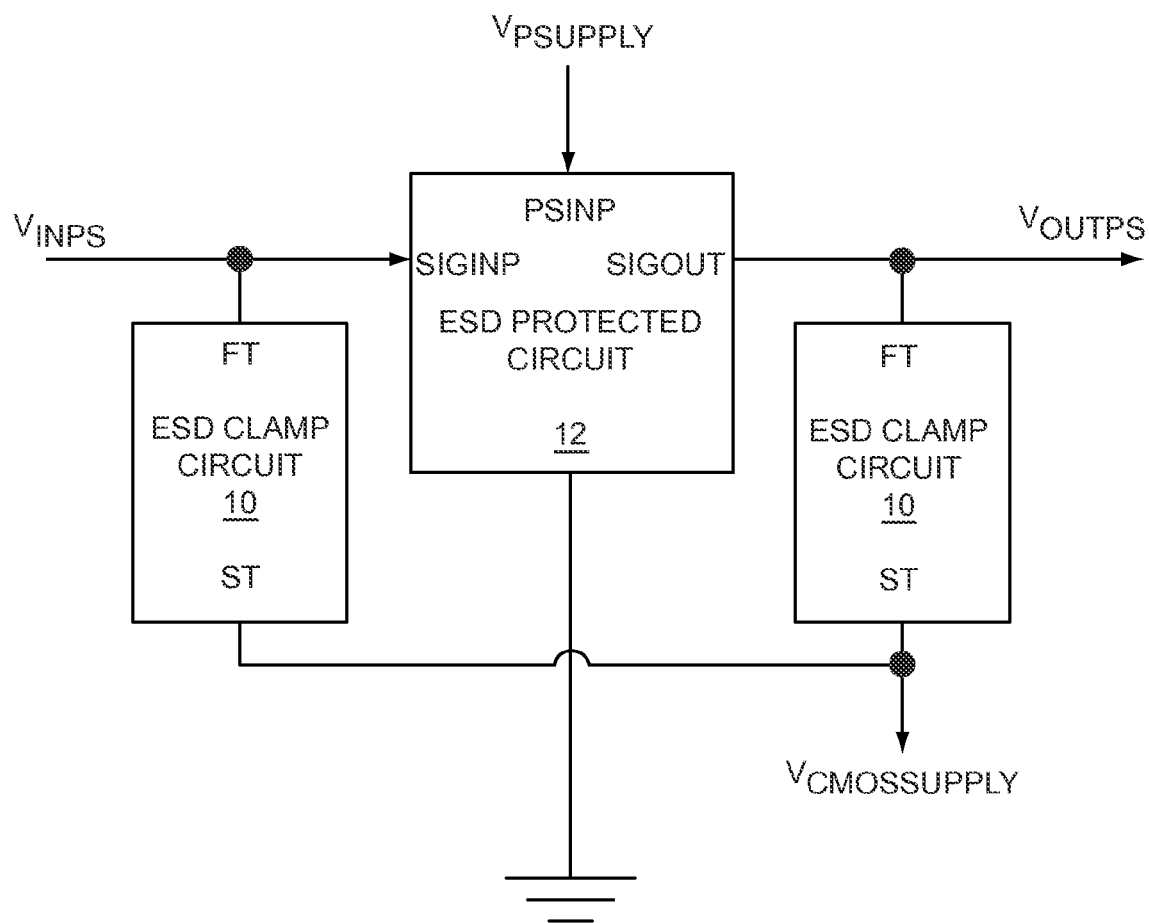
FIG. 3 shows the ESD clamp circuits illustrated in FIG. 1 coupled to a complementary metal oxide semiconductor (CMOS) power supply, according to another embodiment of the present invention.
Figure 4:
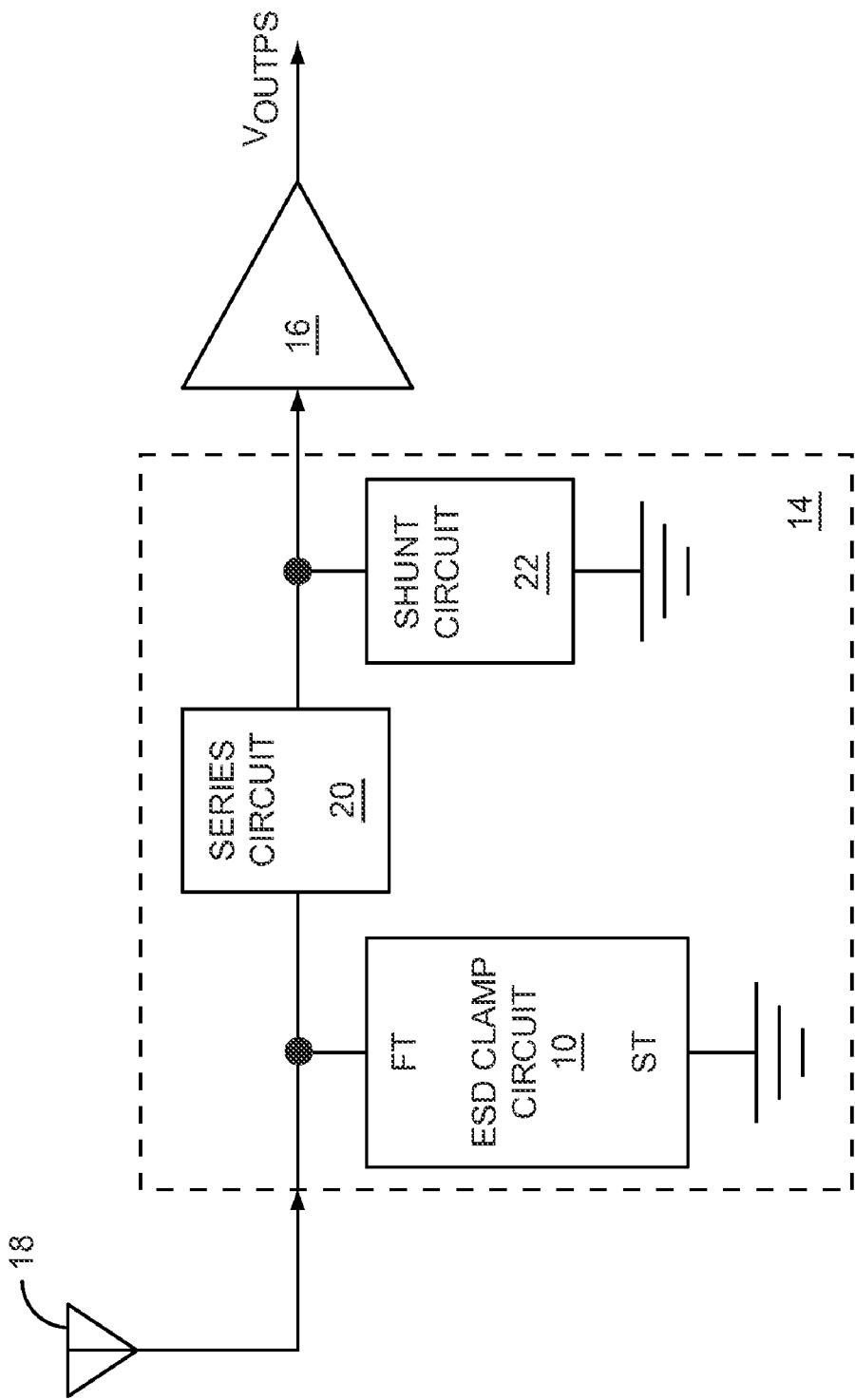
FIG. 4 shows the ESD clamp circuit illustrated in FIG. 1 as part of an impedance matching network, according to an additional embodiment of the present invention.

FIG. 3 shows the ESD clamp circuits 10 illustrated in FIG. 1 with each second terminal ST coupled to a complementary metal oxide semiconductor (CMOS) controller power supply $V_{CMOSSUPPLY}$ instead of the DC power supply $V_{PSUPPLY}$, according to another embodiment of the present invention. FIG. 4 shows one ESD clamp circuit 10 as part of an impedance matching network 14 coupled between an input of an amplifier 16 and a receiving antenna 18, according to an additional embodiment of the present invention. The impedance matching network 14 may include a series circuit 20 coupled between the receiving antenna 18 and the input of the amplifier 16, and a shunt circuit 22 coupled between the input of the amplifier 16 and ground.

The first terminal FT of the ESD clamp circuit 10 may be coupled to the receiving antenna 18 to protect the amplifier 16 from ESD events. The impedance of the ESD clamp circuit 10 during the non-clamping state may be combined with the impedances of the series and shunt circuits 20, 22 to provide a proper impedance match. Alternate embodiments of the present invention may include any number of series circuits 20, any number of shunt circuits 22, any number of ESD clamp circuits 10, or any combination thereof.

Figure 5:
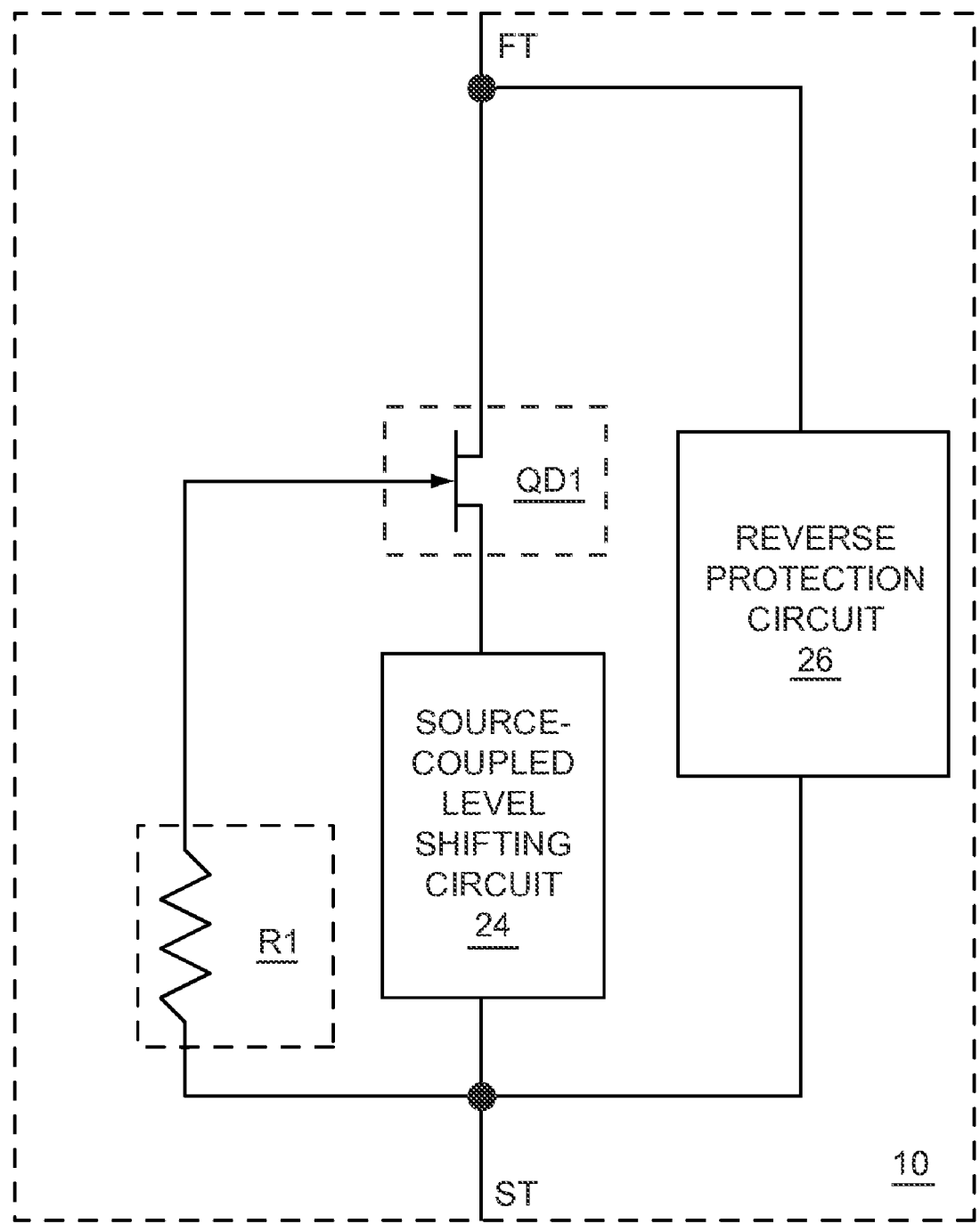
FIG. 5 shows details of the ESD clamp circuit, which includes a depletion-mode field effect transistor (FET) element, a first resistive element coupled between a gate and a source of the FET element, a source-coupled level shifting circuit, and a reverse protection circuit, according to a first embodiment of the ESD clamp circuit.

FIG. 5 shows details of the ESD clamp circuit 10, which includes a depletion-mode FET element QD1, a first resistive element R1, a source-coupled level shifting circuit 24, and a reverse protection circuit 26, according to a first embodiment of the ESD clamp circuit 10. A drain of the depletion-mode FET element QD1 is coupled to the first terminal FT, and a source of the depletion-mode FET element QD1 is coupled to the source-coupled level shifting circuit 24, which is then coupled to the second terminal ST. The first resistive element R1 is coupled between a gate of the depletion-mode FET element QD1 and the second terminal ST. The depletion-mode FET element QD1 has an ON state, which corresponds with the clamping state, and an OFF state, which corresponds with the non-clamping state. The first resistive element R1 biases the gate of the depletion-mode FET element QD1 such that during normal operation, the depletion-mode FET element QD1 is in the OFF state.

The depletion-mode FET element QD1 may be a JFET element, a pHEMT element, a MODFET element, a HIGFET element, a HEMT element, a MESFET element, or any combination thereof. The depletion-mode FET element QD1 may include compound semiconductor material such as Gallium Arsenide, Indium Phosphide, Gallium Nitride, various combinations of elements from columns III and V of the periodic table of the elements, or any combination thereof.

Figure 6:
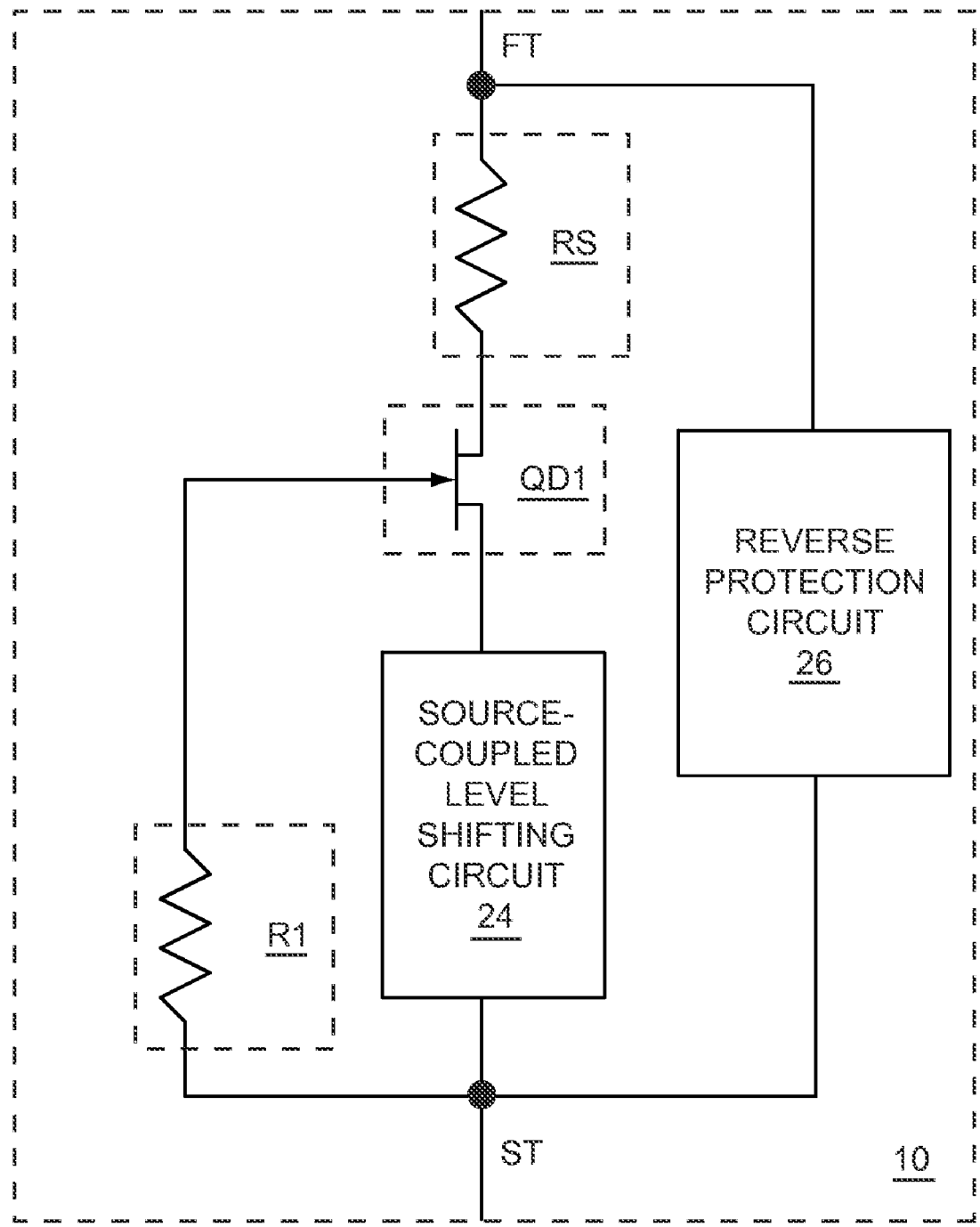
FIG. 6 shows a series resistive element coupled in series with the depletion-mode FET element illustrated in FIG. 5, according to a second embodiment of the ESD clamp circuit.

FIG. 6 shows details of the ESD clamp circuit 10, which include a series resistive element RS, according to a second embodiment of the ESD clamp circuit 10. During the ON state, the depletion-mode FET element QD1 may have an ON state resistance between the drain and the source, and a maximum ON state drain-to-source voltage. An ESD event may be characterized by an ESD voltage, which may be thousands of volts fed from a capacitance, such as a human body. When the depletion-mode FET element QD1 is dissipating the energy from an ESD event during the clamping state, the current provided by the ESD event through an ON state resistance between the drain and the source must not cause the drain-to-source voltage to exceed a maximum ON state drain-to-source voltage, otherwise the depletion-mode FET element QD1 may be damaged.

The series resistive element RS is coupled between the drain of the depletion-mode FET element QD1 and the first terminal FT to limit the current through the depletion-mode FET element QD1 during an ESD event. By limiting the current, the drain-to-source voltage may be held within the maximum ON state drain-to-source voltage; however, adding resistance may reduce the effectiveness of the ESD clamp circuit 10 to protect from ESD events. Therefore, the value of the series resistive element RS may be chosen to balance the ruggedness of the ESD clamp circuit 10 and the ruggedness of the ESD protected circuit 12. In an exemplary embodiment of the present invention, the maximum ON state drain-to-source voltage is about 12 volts. A resistance of the series resistive element RS may be less than about 20 ohms. In an exemplary embodiment of the present invention, the resistance of the series resistive element RS is about 10 ohms.

The depletion-mode FET element QD1 may be a JFET element, a pHEMT element, a MODFET element, a HIGFET element, a HEMT element, a MESFET element, or any combination thereof. The depletion-mode FET element QD1 may include compound semiconductor material such as Gallium Arsenide, Indium Phosphide, Gallium Nitride, various combinations of elements from columns III and V of the periodic table of the elements, or any combination thereof.

Figure 7:
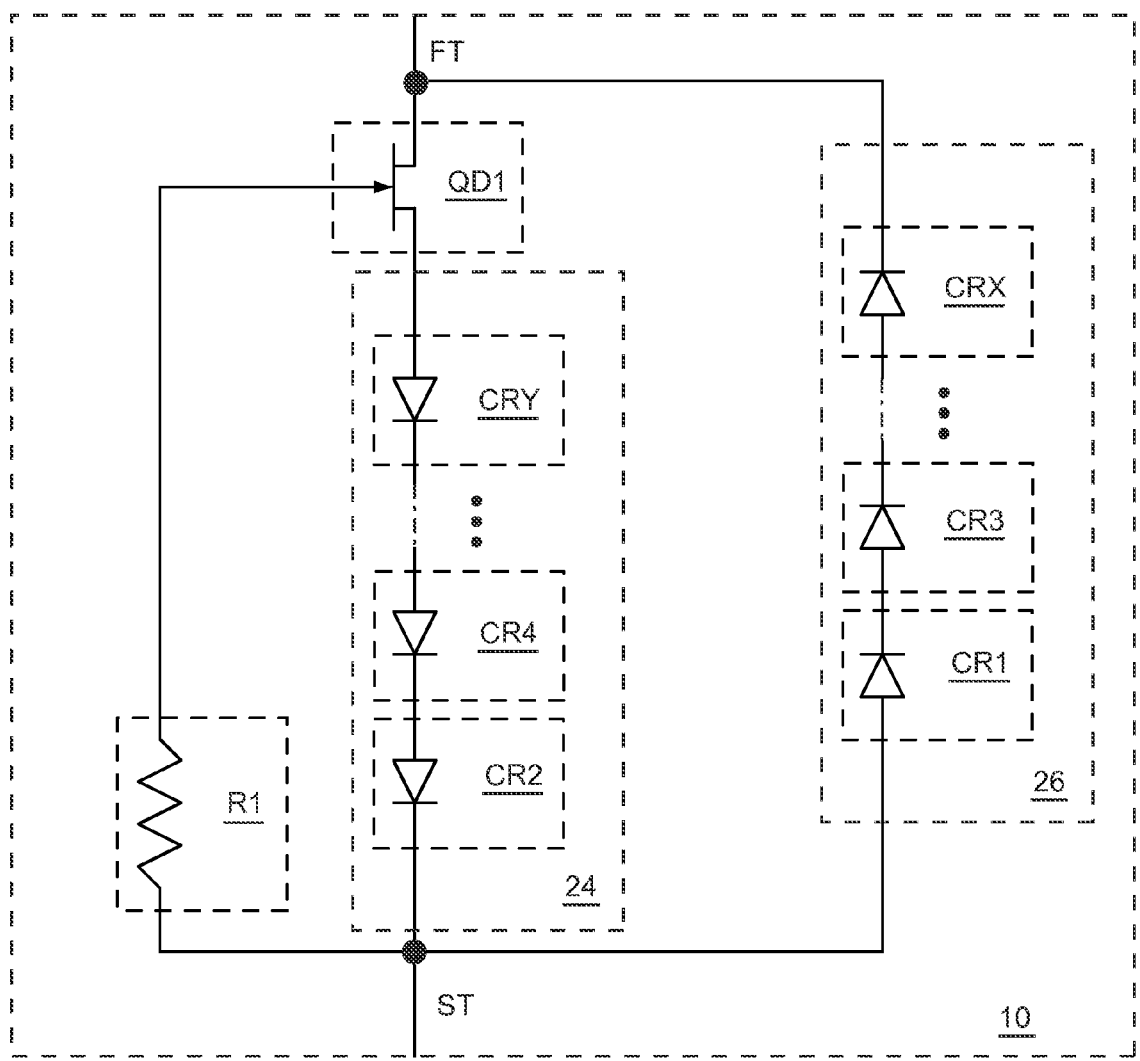
FIG. 7 shows details of the source-coupled level shifting circuit and the reverse protection circuit illustrated in FIG. 5, according to one embodiment of the ESD clamp circuit.

FIG. 7 shows details of the source-coupled level shifting circuit 24 and the reverse protection circuit 26 illustrated in FIG. 5, according to one embodiment of the present invention. The source-coupled level shifting circuit 24 is comprised of a series-coupled chain, or stack, of diodes CR2, CR4, CRY connected in forward bias between the source of the depletion-mode FET element QD1 and the second terminal ST. An anode of each diode in the stack CR2, CR4, CRY is oriented toward the source side of the depletion-mode FET element QD1 and a cathode of each diode in the stack CR2, CR4, CRY is oriented toward the second terminal ST. The stack CR2, CR4, CRY provides a voltage drop between the depletion-mode FET element QD1 and the second terminal ST such that the source is raised above the potential of the second terminal ST and the gate-source voltage across the depletion-mode FET element QD1 is sufficient to keep the normally-on depletion-mode FET element QD1 in an OFF state in the absence of an ESD pulse. The reverse protection circuit 26 is comprised of a chain, or stack, of diodes CR1, CR3, CRX connected in a reverse bias configuration between the first terminal FT and the second terminal ST. An anode of each diode in the stack CR1, CR3, CRX is oriented toward the second terminal ST and a cathode of each diode in the stack CR1, CR3, CRX is oriented toward the first terminal FT.

Figure 8:
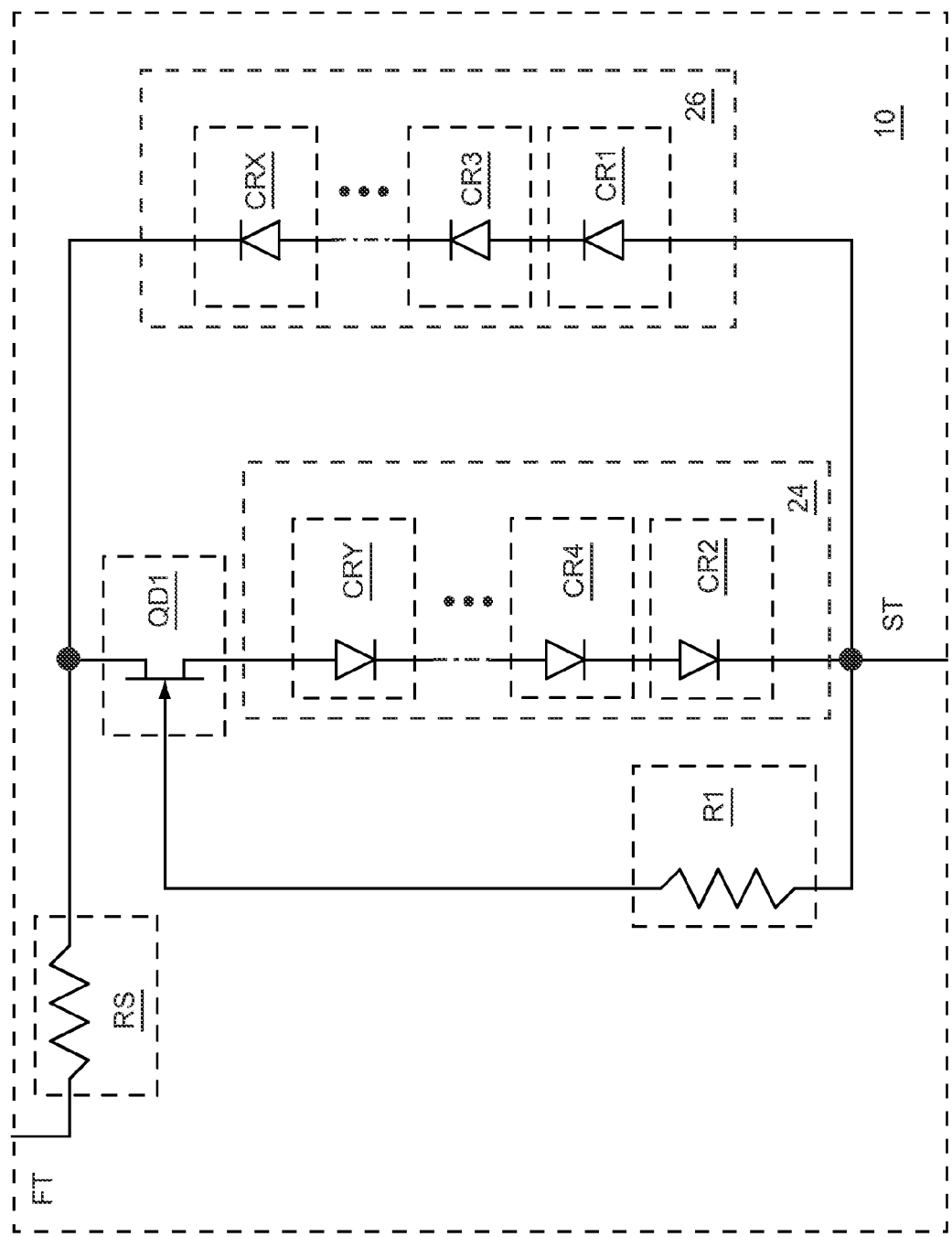
FIG. 8 shows details of the source-coupled level shifting circuit and the reverse protection circuit illustrated in FIG. 6, according to another embodiment of the ESD clamp circuit.

FIG. 8 is similar to FIG. 7 and shows details of the source-coupled level shifting circuit 24 and the reverse protection circuit 26 illustrated in FIG. 6, according to another embodiment of the present invention. The series resistive element RS is coupled between the drain of the depletion-mode FET element QD1 and the first terminal FT. By limiting the current, the drain-to-source voltage may be held within the maximum ON state drain-to-source voltage; however, adding resistance may reduce the effectiveness of the ESD clamp circuit 10 to protect from ESD events. Therefore, the value of the series resistive element RS may be chosen to balance the ruggedness of the ESD clamp circuit 10 and the ruggedness of the ESD protected circuit 12.

Figure 9:
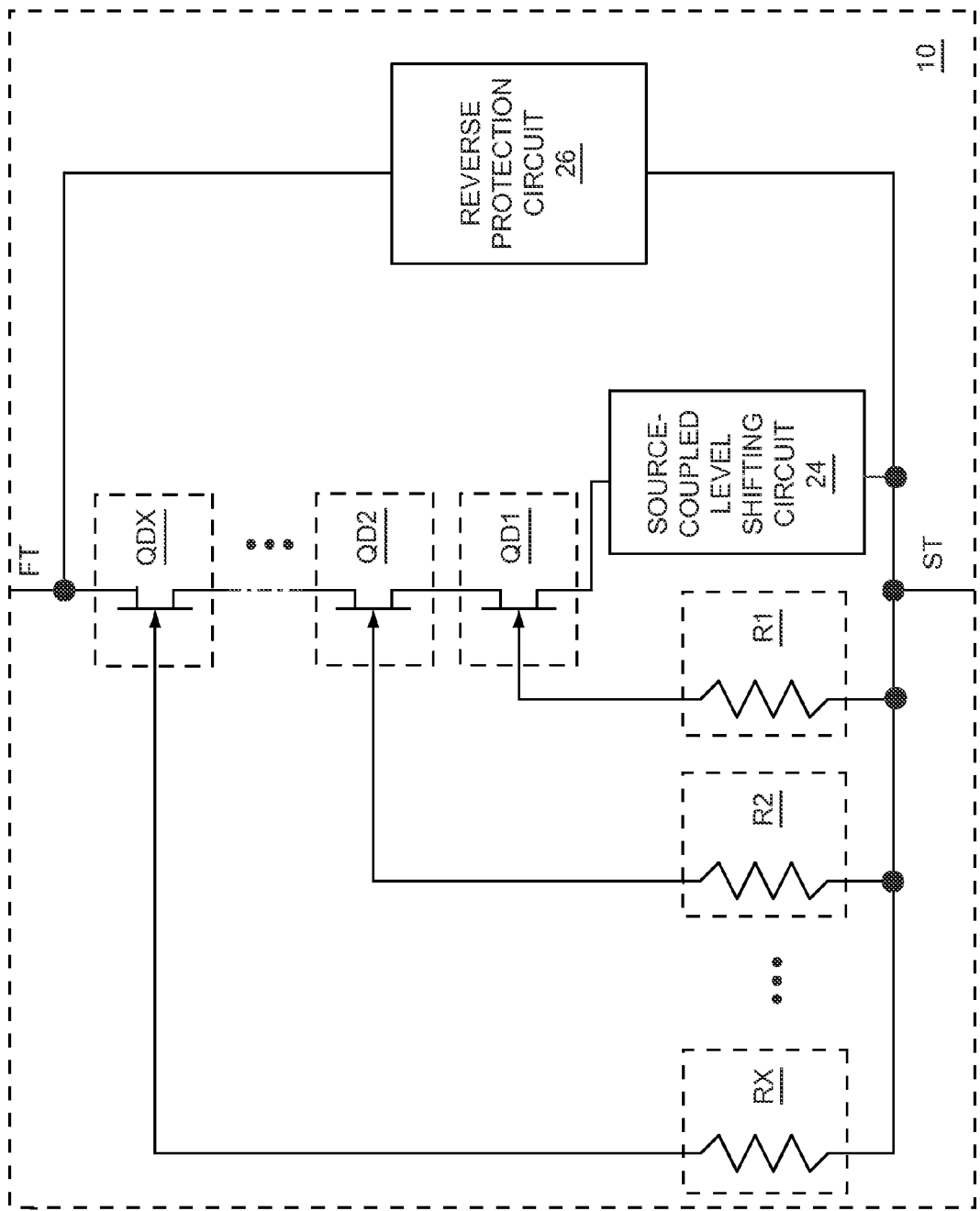
FIG. 9 shows multiple depletion-mode FET elements coupled in series according to a third embodiment of the ESD clamp circuit.

FIG. 9 shows multiple depletion-mode FET elements QD1, QD2, QDX coupled in series, according to a third embodiment of the ESD clamp circuit 10. The drain of one depletion-mode FET element is coupled to the source of another depletion-mode FET element. At least the second depletion-mode FET element QD2 is coupled between the drain of the first depletion-mode FET element QD1 and the first terminal FT. First, second, up to and including an Xth resistive elements R1, R2, RX are coupled between the gates of each of the multiple depletion-mode FET elements QD1, QD2, QDX and the second terminal ST. For example, an Xth resistive element RX is coupled between the gate of the Xth depletion-mode FET element QDX and the second terminal ST. The series coupling may allow each of the multiple depletion-mode FET elements QD1, QD2, QDX to be smaller, and may increase the maximum voltage between the first and second terminals FT, ST during the clamping state, thereby increasing the energy rating of the ESD clamp circuit 10. Additionally, reducing the size of the multiple depletion-mode FET elements QD1, QD2, QDX may reduce parasitic capacitances and improve linearity of the ESD clamp circuit 10.

The multiple depletion-mode FET elements QD1, QD2, QDX may include at least one JFET element, at least one pHEMT element, at least one MODFET element, at least one HIGFET element, at least one HEMT element, at least one MESFET element, or any combination thereof. The multiple depletion-mode FET elements QD1, QD2, QDX may include compound semiconductor material such as Gallium Arsenide, Indium Phosphide, Gallium Nitride, various combinations of elements from columns III and V of the periodic table of the elements, or any combination thereof.

Figure 10:
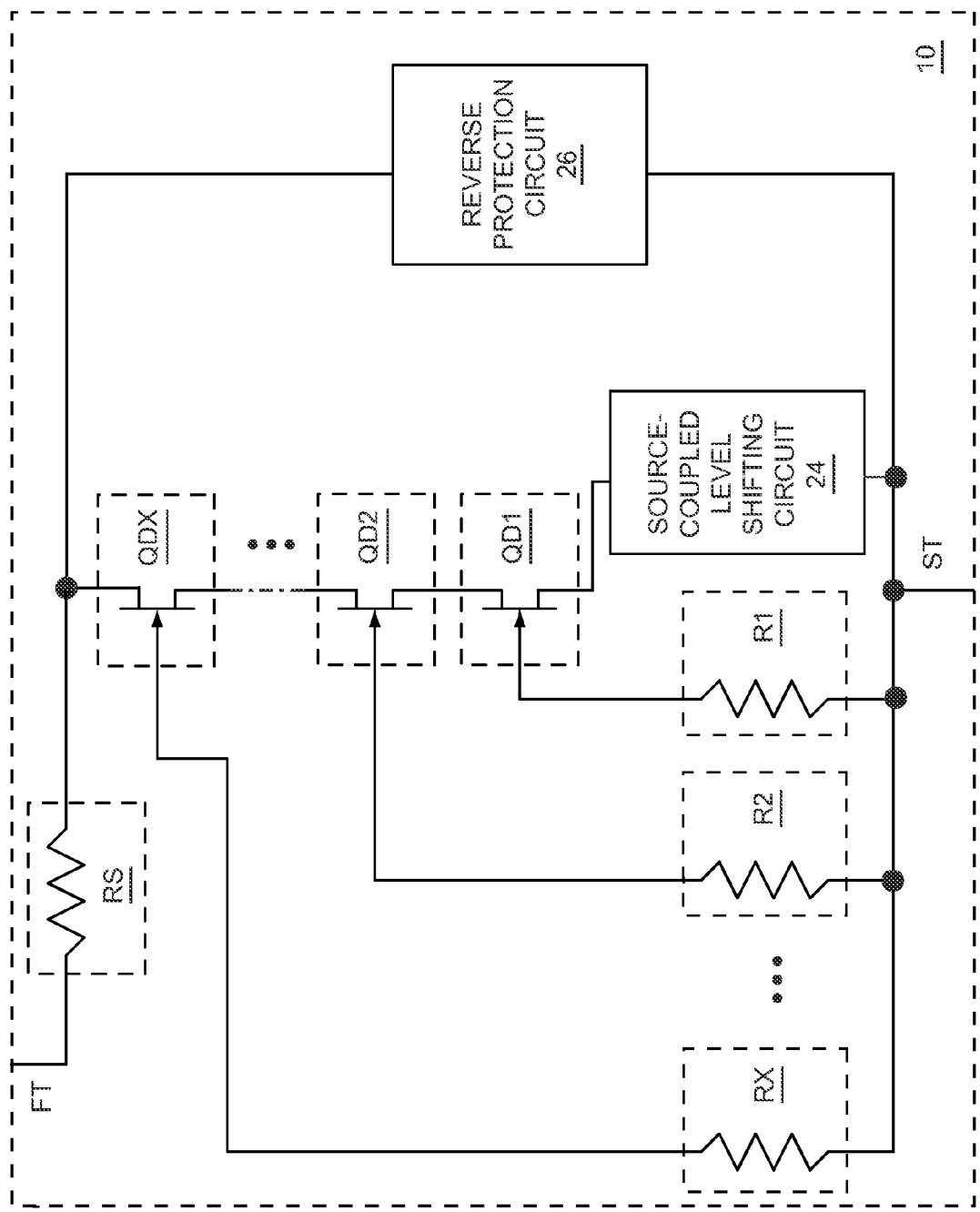
FIG. 10 shows multiple depletion-mode FET elements and the series resistive element coupled in series according to a fourth embodiment of the ESD clamp circuit.

FIG. 10 is similar to FIG. 9 and shows the series resistive element RS coupled between the drain of the Xth depletion-mode FET element QDX and the first terminal FT, according to a fourth embodiment of the ESD clamp circuit 10. By limiting the current, the drain-to-source voltage may be held within the maximum ON state drain-to-source voltage; however, adding resistance may reduce the effectiveness of the ESD clamp circuit 10 to protect from ESD events. Therefore, the value of the series resistive element RS may be chosen to balance the ruggedness of the ESD clamp circuit 10 and the ruggedness of the ESD protected circuit 12.

Figure 11:
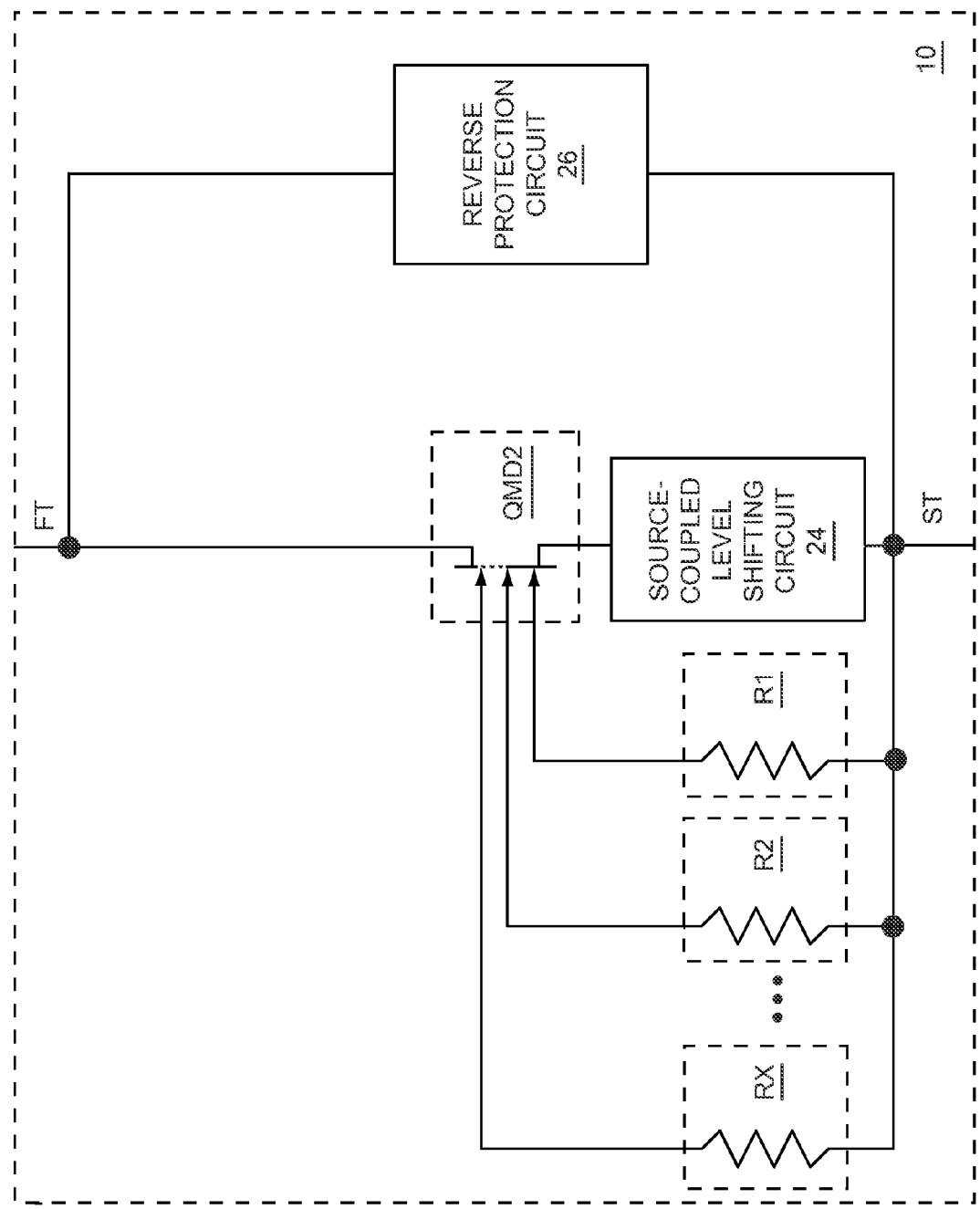
FIG. 11 shows a multi-gate depletion-mode FET element according to a fifth embodiment of the ESD clamp circuit.

FIG. 11 shows a multi-gate depletion-mode FET element QMD2 according to a fifth embodiment of the ESD clamp circuit 10. Functionally, the multi-gate depletion-mode FET element QMD2 may operate in a similar manner, and have the same benefits, as the combination of the multiple depletion-mode FET elements QD1, QD2, QDX illustrated in FIG. 9. The multi-gate depletion-mode FET element QMD2 may be constructed with only one source and one drain metal contact.

Elimination of the metal interconnections between adjacent gates reduces the size of the multi-gate depletion-mode FET element QMD2 when compared with the overall size of the multiple depletion-mode FET elements QD1, QD2, QDX illustrated in FIG. 9. The size of the multi-gate depletion-mode FET element QMD2 may approach the size of only one or two of the multiple depletion-mode FET elements QD1, QD2, QDX. Reducing the overall size of the FET circuitry may reduce parasitic capacitances and improve linearity of the ESD clamp circuit 10. The multi-gate depletion-mode FET element QMD2 may be a JFET element, a pHEMT element, a MODFET element, a HIGFET element, a HEMT element, a MESFET element, or any combination thereof. The multi-gate depletion-mode FET element QMD2 may include compound semiconductor material such as Gallium Arsenide, Indium Phosphide, Gallium Nitride, various combinations of elements from columns III and V of the periodic table of the elements, or any combination thereof.

Figure 12:
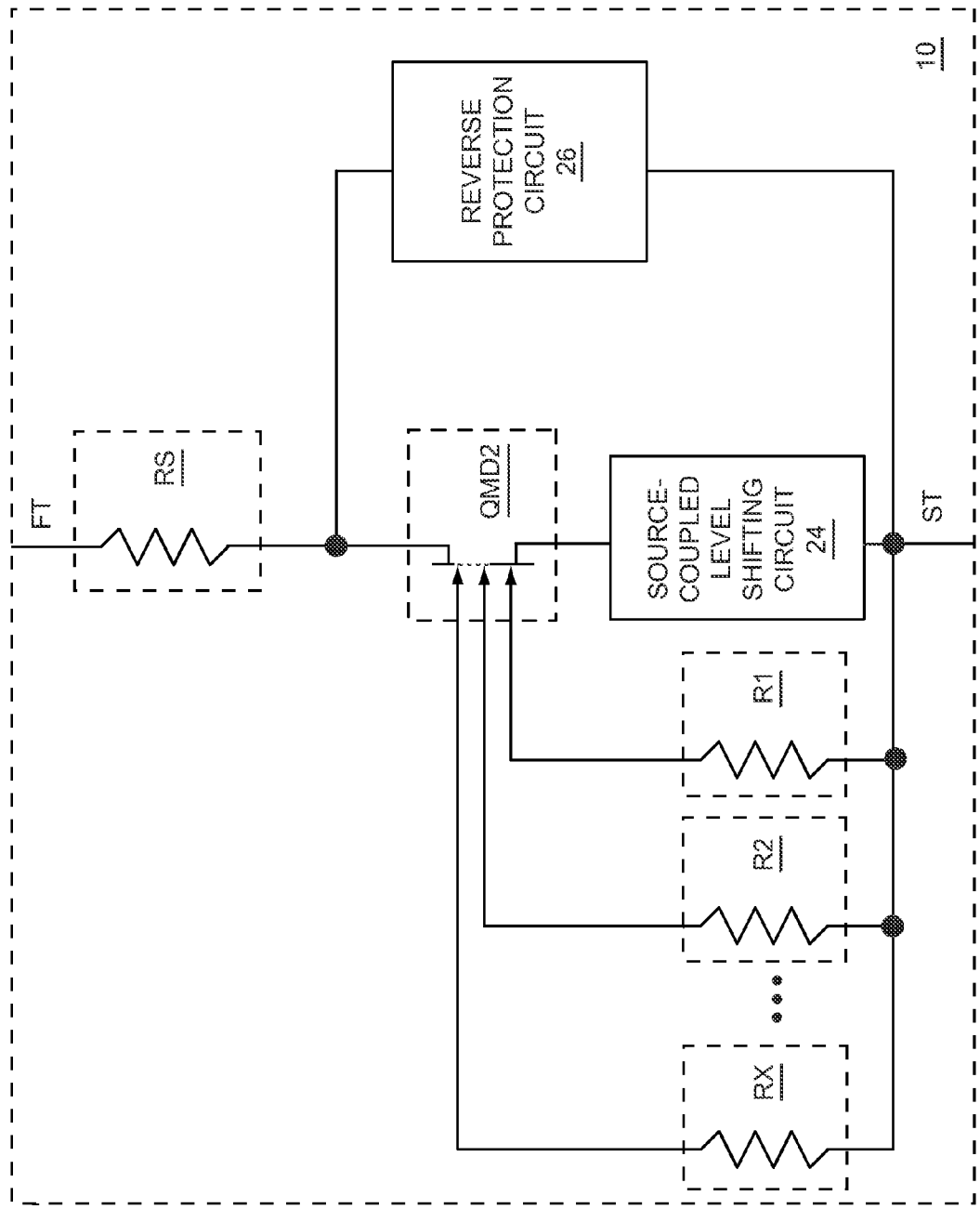
FIG. 12 shows the multi-gate depletion-mode FET element and the series resistive element coupled in series according to a sixth embodiment of the ESD clamp circuit.

FIG. 12 is similar to FIG. 11 and shows the series resistive element RS coupled between the drain of the multi-gate depletion-mode FET element QMD2 and the first terminal FT, according to a sixth embodiment of the ESD clamp circuit 10. By limiting the current, the drain-to-source voltage may be held within the maximum ON state drain-to-source voltage; however, adding resistance may reduce the effectiveness of the ESD clamp circuit 10 to protect from ESD events. Therefore, the value of the series resistive element RS may be chosen to balance the ruggedness of the ESD clamp circuit 10 and the ruggedness of the ESD protected circuit 12. A seventh embodiment of the ESD clamp circuit 10 includes multiple multi-gate depletion-mode FET elements (not shown) coupled in series. An eighth embodiment of the ESD clamp circuit 10 includes multiple multi-gate depletion-mode FET elements (not shown) coupled in series with the series resistive element RS.

Normally, the first terminal FT may have a positive voltage with respect to the voltage at the second terminal ST. The first resistive element R1 and the source-coupled level shifting circuit 24 hold the gate-to-source voltage such that the depletion-mode FET element QD1 is in the OFF state in the absence of an ESD event. However, an ESD event producing a positive voltage at the first terminal FT with respect to the voltage at the second terminal ST in excess of the ESD trigger voltage will couple a voltage through the drain to the gate of the depletion-mode FET element QD1 to transition the depletion-mode FET element QD1 into its ON state, thereby transitioning the ESD clamp circuit 10 into its clamping state.

In an ESD event producing a negative voltage at the first terminal FT with respect to the second terminal ST, the reverse protection circuit 26 is turned ON while the depletion-mode FET element QD1 remains OFF. The reverse protection circuit 26 is turned ON when the voltage generated by the ESD event exceeds the trigger voltage of the reverse protection circuit 26. In one embodiment of the reverse protection circuit 26, a stack of reverse biased diodes can be used. The number of diodes in the reverse protection circuit 26 is chosen such that the trigger voltage of the reverse protection circuit 26 is sufficiently lower than the breakdown voltage of the ESD protected circuit 12.

The embodiments of the present invention illustrated in FIGS. 5 through 12 are shown with depletion-mode FET elements; however, those skilled in the art will recognize that the concepts demonstrated therein could be applied to circuits using normally-on FET elements and are within the scope of the present invention. A normally-on device includes n-channel FETs such as metal-oxide-semiconductor FETs (MOSFETs). Additionally, the embodiments of the present invention illustrated in FIGS. 5 through 12 function with the first terminal FT normally operating with a positive voltage with respect to the second terminal ST; however, those skilled in the art will recognize that the concepts demonstrated therein could be applied to circuits that function with the first terminal FT normally operating with a negative voltage with respect to the second terminal ST and are within the scope of the present invention.

Those skilled in the art will recognize improvements and modifications to the preferred embodiments of the present invention. All such improvements and modifications are considered within the scope of the concepts disclosed herein and the claims that follow.

What is claimed is:

1. An electrostatic discharge (ESD) clamp circuit comprising:
   a first terminal;
   a second terminal having a first voltage with respect to a voltage at the first terminal, such that the first terminal and the second terminal are coupled between an ESD protected circuit and a direct current (DC) reference;
   a reverse protection circuit coupled between the first terminal and the second terminal;
   a first depletion-mode field effect transistor (FET) element formed using a compound semiconductor material and comprising:
   a first drain coupled to the first terminal;
   a first source; and
   a first gate;
   a source-coupled level shifting circuit coupled between the first source and the second terminal;
   a first resistive element coupled between the first gate and the second terminal,
   wherein when the first voltage exceeds a first threshold, the ESD clamp circuit is in a clamping state;
   a plurality of depletion-mode pseudomorphic high electron mobility transistor (pHEMT) elements:
   comprising the first depletion-mode FET element;
   a plurality of gates comprising the first gate; and
   such that each of the plurality of depletion-mode pHEMT elements is coupled in series to form a chain having the first drain at one end of the chain and a second source at another end of the chain, wherein the second source is coupled to the source-coupled level shifting circuit; and
   a plurality of resistive elements comprising the first resistive element, such that each of the plurality of resistive elements is coupled between a corresponding each of the plurality of gates and the second terminal.

2. The ESD clamp circuit of claim 1 wherein the compound semiconductor material comprises at least one selected from a group consisting of Gallium Arsenide, Indium Phosphide, and Gallium Nitride.

3. The ESD clamp circuit of claim 1 wherein the compound semiconductor material comprises a combination of at least one element selected from column III of a periodic table of the elements and at least one element selected from column V of the periodic table of the elements.

4. The ESD clamp circuit of claim 1 wherein the first depletion-mode FET element comprises one selected from a group consisting of a junction field effect transistor (JFET) element, a pseudomorphic high electron mobility transistor (pHEMT) element, a high electron mobility transistor (HEMT) element, a modulation-doped field effect transistor (MODFET) element, a heterojunction-insulator-gate field effect transistor (HIGFET) element, and a metal-semiconductor field effect transistor (MESFET) element.

5. The ESD clamp circuit of claim 1 wherein the first depletion-mode FET element comprises a single-gate depletion-mode pseudomorphic high electron mobility transistor (pHEMT) element.

6. The ESD clamp circuit of claim 5 further comprising a series resistive element coupled between the first drain and the first terminal.

7. The ESD clamp circuit of claim 1 further comprising a series resistive element coupled between the first terminal and the first drain.

8. The ESD clamp circuit of claim 1 wherein the first drain is directly coupled to the first terminal.

9. The ESD clamp circuit of claim 1 further comprising a series resistive element coupled between the first drain and the first terminal.

10. The ESD clamp circuit of claim 1 wherein the ESD protected circuit comprises a signal input and the first terminal and the second terminal are coupled between the signal input and the DC reference.

11. The ESD clamp circuit of claim 1 wherein the ESD protected circuit comprises a signal output and the first terminal and the second terminal are coupled between the signal output and the DC reference.

12. The ESD clamp circuit of claim 1 wherein the ESD protected circuit is fed from a complementary metal oxide semiconductor (CMOS) controller power supply and the first terminal and the second terminal are coupled between the CMOS controller power supply and the DC reference.

13. The ESD clamp circuit of claim 1 wherein the ESD protected circuit comprises an impedance matching network.

14. The ESD clamp circuit of claim 1 wherein the DC reference is about ground.

15. The ESD clamp circuit of claim 1 wherein the reverse protection circuit comprises a first diode element having a first anode coupled to the second terminal and a first cathode coupled to the first terminal.

16. The ESD clamp circuit of claim 1 wherein the source-coupled level shifting circuit comprises a first diode element having a first anode coupled to the first source and a first cathode coupled to the second terminal.

17. The ESD clamp circuit of claim 1 wherein the DC reference is a DC power supply.

18. The ESD clamp circuit of claim 1 wherein when the first voltage is positive and exceeds a second threshold, the reverse protection circuit is in the clamping state.

19. An electrostatic discharge (ESD) clamp circuit comprising:
a first terminal;
a second terminal having a first voltage with respect to a voltage at the first terminal, such that the first terminal and the second terminal are coupled between an ESD protected circuit and a direct current (DC) reference;
a reverse protection circuit coupled between the first terminal and the second terminal;
a first depletion-mode field effect transistor (FET) element formed using a compound semiconductor material and comprising:
a first drain coupled to the first terminal;
a first source; and
a first gate;
a source-coupled level shifting circuit coupled between the first source and the second terminal;
a first resistive element coupled between the first gate and the second terminal, wherein when the first voltage exceeds a first threshold, the ESD clamp circuit is in a clamping state; and
a plurality of resistive elements comprising the first resistive element, wherein the first depletion-mode FET element further comprises a multiple gate depletion-mode pseudomorphic high electron mobility transistor (pHEMT) element having a plurality of gates comprising the first gate, such that each of the plurality of resistive elements is coupled between a corresponding each of the plurality of gates and the second terminal.

20. The ESD clamp circuit of claim 19 further comprising a series resistive element coupled between the first drain and the first terminal.

21. An electrostatic discharge (ESD) clamp circuit comprising:
a first terminal;
a second terminal having a first voltage with respect to a voltage at the first terminal, such that the first terminal and the second terminal are coupled between an ESD protected circuit and a direct current (DC) reference;
a reverse protection circuit coupled between the first terminal and the second terminal;
a first depletion-mode field effect transistor (FET) element formed using a compound semiconductor material and comprising:
a first drain coupled to the first terminal;
a first source; and
a first gate;
a source-coupled level shifting circuit coupled between the first source and the second terminal;
a first resistive element coupled between the first gate and the second terminal, wherein when the first voltage exceeds a first threshold, the ESD clamp circuit is in a clamping state; and
wherein the reverse protection circuit comprises a first plurality of diode elements, such that each of the first plurality of diode elements is coupled in series to form a first chain having a first anode at one end of the first chain and a first cathode at another end of the first chain, wherein the first anode is coupled to the second terminal and the first cathode is coupled to the first terminal.

22. An electrostatic discharge (ESD) clamp circuit comprising:
a first terminal;
a second terminal having a first voltage with respect to a voltage at the first terminal, such that the first terminal and the second terminal are coupled between an ESD protected circuit and a direct current (DC) reference;

a reverse protection circuit coupled between the first terminal and the second terminal;
a first depletion-mode field effect transistor (FET) element formed using a compound semiconductor material and comprising:
a first drain coupled to the first terminal;
a first source; and
a first gate;
a source-coupled level shifting circuit coupled between the first source and the second terminal;
a first resistive element coupled between the first gate and the second terminal, wherein when the first voltage exceeds a first threshold, the ESD clamp circuit is in a clamping state; and
wherein the source-coupled level shifting circuit comprises a first plurality of diode elements, such that each of the first plurality of diode elements is coupled in series to form a first chain having a first anode at one end of the first chain and a first cathode at another end of the first chain, wherein the first anode is coupled to the first source and the first cathode is coupled to the second terminal.

23. The ESD clamp circuit of claim 22 wherein the reverse protection circuit comprises a second plurality of diode elements, such that each of the second plurality of diode elements is coupled in series to form a second chain having a second anode at one end of the second chain and a second cathode at another end of the second chain, wherein the second anode is coupled to the second terminal and the second cathode is coupled to the first terminal.

* * * * *